United States Patent [19]

Bell et al.

[11] 4,078,711
[45] Mar. 14, 1978

[54] METALLURGICAL METHOD FOR DIE ATTACHING SILICON ON SAPPHIRE DEVICES TO OBTAIN HEAT RESISTANT BOND

[75] Inventors: Herbert A. Bell, La Habra; Micheal E. McCoy, Orange; Francis J. Woolston, Santa Ana, all of Calif.

[73] Assignee: Rockwell International Corporation, El Segundo, Calif.

[21] Appl. No.: 787,637

[22] Filed: Apr. 14, 1977

[51] Int. Cl.² ..................... B23K 31/02; B01J 17/00
[52] U.S. Cl. ..................................... 228/123; 228/263
[58] Field of Search ............ 228/123, 124, 179, 185, 228/252, 263

[56] References Cited

U.S. PATENT DOCUMENTS

| 3,200,490 | 8/1965 | Clymer | 228/123 |
|---|---|---|---|
| 3,298,093 | 1/1967 | Cohen | 228/123 |
| 3,310,866 | 3/1967 | Anderson | 228/123 X |
| 3,368,274 | 2/1968 | Brunet | 228/123 |
| 3,492,719 | 2/1970 | Zeitman | 228/123 X |
| 3,956,821 | 5/1976 | Martin | 228/263 X |
| 3,986,251 | 10/1976 | Altemus | 228/179 X |

Primary Examiner—Donald G. Kelly
Attorney, Agent, or Firm—H. Fredrick Hamann; G. Donald Weber, Jr.; Gilbert H. Friedman

[57] ABSTRACT

A method for attaching a silicon-on-sapphire (SOS) device to a gold-plated surface of a package for the device. A layer of a metal adherent to both sapphire and gold such as, for example, tungsten, is deposited on the back side of a wafer of the devices. A layer of gold is then deposited on the tungsten layer. A preform of an alloy compatible with gold, such as gold-germanium, interposed between and in contact with the die and the package, is heated and then cooled to bond the die to the surface of the package.

12 Claims, 1 Drawing Figure

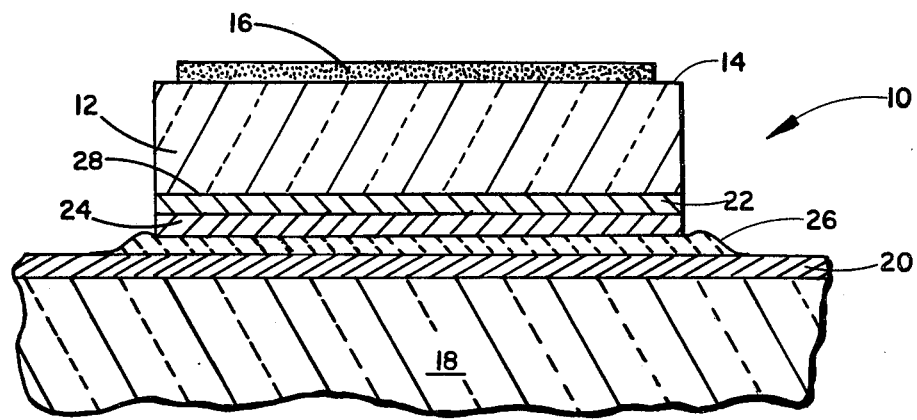

METALLURGICAL METHOD FOR DIE ATTACHING SILICON ON SAPPHIRE DEVICES TO OBTAIN HEAT RESISTANT BOND

The invention herein described was made in the course of or under a contract or subcontract thereunder, with the Air Force.

BACKGROUND OF THE INVENTION

1. Field of the Invention

The present invention relates generally to improvements in methods for die attaching semiconductor devices to packages for the devices and, more particularly, to a new and improved method of die attaching a silicon-on-sapphire (SOS) semiconductor device to a package. The method provides a bond which maintains its mechanical integrity and heat conduction properties at relatively high temperatures.

2. Description of the Prior Art

It has been the common practice to use an organic resin such as an epoxy to attach an SOS device die to a support member for the die in a suitable device package. However, as application requirements have raised the temperature at which such devices and their attachment bond are required to operate, difficulties have been encountered. Organic resins tend to deteriorate at temperatures of about 200° C and higher. Outgassing and bubbling occur in the bonding material, the mechanical integrity of the bond is jeopardized, and the heat conduction properties of the bonding material are impaired.

Such problems have not been as apparent in the case where the more conventional dice of silicon semiconductor devices are attached to package members through a layer of gold. As is well known, gold and silicon form an alloy useful for bonding silicon dice. However, gold has little or no adherent affinity for sapphire. The problems of SOS die attachment have been overcome by the present invention.

SUMMARY OF THE INVENTION

The general purpose of this invention is to provide a method of die attaching SOS devices to packages for the devices wherein the bond produced remains mechanically sound and efficiently heat conductive at temperatures up to at least 250° C. In the preferred embodiment, a layer of titanium or tungsten is deposited immediately on the back, or sapphire, side of an SOS wafer. A layer of gold is then deposited on the tungsten or titanium layer. After the water is diced, an individual die is subsequently attached to a gold-plated surface portion of a device package by heating a preform of an alloy, for example, gold-germanium or gold-silicon, in contact with the gold-plated surface portion of the package and the outside metal layer of gold on the back side of a sapphire die. The alloy used is preferably a eutectic alloy.

BRIEF DESCRIPTION OF THE DRAWINGS

The sole FIGURE is a schematic cross-sectional view of an SOS device die bonded to a metal-plated surface of a device package in accordance with this invention.

DESCRIPTION OF A PREFERRED EMBODIMENT

The FIGURE shows a die 10 comprising a sapphire substrate 12 having a front surface 14 on which a film 16 of semiconductor material, for example silicon, has been epitaxially deposited. A plurality of electrical and electronic components are ordinarily fabricated in the film 16 and interconnected therein to form an electronic device. A large number of such devices are ordinarily fabricated simultaneously on a wafer cut from a single crystal of sapphire. After fabrication, the wafer is cut, or diced, into individual device dice of which the die 10 is an example. The dicing may be accomplished using precision cutting tools such as saws or laser equipment which are manufactured for this purpose and are well known in the art.

The individual die 10 is commonly mounted in a package or housing which provides mechanical support, environmental protection, and means for interconnection with other components of a system or sub-system. Such a package usually is adapted to provide for conduction of heat away from energy dissipating elements in the film 16. A structural member 18 of such a package is represented in the FIGURE. Structural member 18 has a layer 20 of gold plated thereon.

To prepare the die 10 for die attaching, a layer 22 of a metal highly adherent to sapphire such as tungsten or titanium is deposited directly on the back surface 28 of sapphire wafer from which substrate 12 is produced. Tungsten and titanium are particularly useful for this purpose because these metals adhere well to both sapphire and gold. The preferred technique for depositing the layer 22 of tungsten or titanium is sputtering in a high vacuum planar magnetron deposition chamber using an RF sputtering power supply. A planar magnetron sputtering system is essential for metallizing SOS devices in order to preclude secondary radiation damage to the devices. When this technique is used, the vacuum chamber is back-filled with ultra-pure argon in order to avoid system contamination and thereby assure that the deposited layers are high in quality. Layer 22 of deposited metal is preferably about 1000 angstroms thick. Subsequently, a layer 24 of gold is deposited over the tungsten or titanium layer 22. Depositing by sputtering in a vacuum chamber is also the preferred approach for providing gold layer 24. To allow uninterrupted vacuum conditions between the deposition of the titanium or tungsten and the gold, dual sputtering guns may be used in the vacuum chamber. The preferred thickness for the deposited gold layer 24 is on the order of 100 microinches.

After the layers 22 and 24 of metal are deposited on the back of a wafer, the wafer is diced, as discussed above, into individual dice of which die 10 is an example. A preform 26 of an alloy is then positioned to contact a suitable portion of structural member 18 and then a die 10 is placed in contact with the preform 26. A suitable eutectic alloy for die-attaching the die 10 to the gold layer 20 on the structural member 18 is gold-germanium (88% Au, 12% Ge). Standard die attach equipment, well known to those skilled in the art, having a stage temperature set to heat the structural member 18 of the device package to about 390° C may then be used to bond the die 10 to the member 18 by heating the preform 26 until it liquifies and then allowing it to cool and solidify. Gold-germanium is the alloy of choice here since it is desirable to die attach with a eutectic having a sufficiently high melting point so that the bond will not be adversely affected by subsequent operations with lower melting-point alloys. For example, a lid may be hermetically sealed to a package for the die 10 using a gold-tin alloy which melts at 280° C without affecting a gold-germanium eutectic die attachment. A gold-silicon alloy may also be used effectively for attaching a die to a package. Die-attach bonding is preferably accomplished in an inert atmosphere to minimize the occurrence of undesired chemical reactions at the elevated temperatures involved. A cloud of nitrogen surrounding the workpieces undergoing die attachment is satisfactory for this purpose.

Whereas the present invention has been described with respect to specific embodiments thereof, it will be understood that various changes and modifications will be suggested to one skilled in the art. For example, chromium, nickel-chromium and molybdenum are metals which can be satisfactorily deposited as highly adherent films on sapphire by either sputtering, electron-beam evaporation, or filament evaporation. The use of chromium as the sapphire-adherent layer is compatible with the use of silver as the subsequently deposited layer and a silver-plated device package. As another example, a gold-tin eutectic alloy may be used for die-attach bonding where subsequent processing uses even lower temperature solders. It is intended to encompass such changes and modifications to fall within the scope of the appended claims.

We claim:

1. A method of forming a heat-resistant bond between a sapphire surface of an SOS device and a metallic surface of a device package for said device wherein said metallic surfaces is of a first metal, said method comprising:

depositing a layer of a second metal on the sapphire surface of an SOS wafer, wherein said second metal is adherent to both sapphire and said first metal;

depositing a layer of said first metal on said layer of said second metal;

positioning the metal layers on said sapphire surface of said SOS device adjacent said metallic surface of said device package;

interposing a preform of an alloy between said metallic surface and said metal layers on said sapphire surface wherein said alloy is compatible with said first metal for bonding;

heating and then cooling said preform, said device package metallic surface, and said layer of said first metal on said sapphire surface of said SOS devices to bond said sapphire surface to each device package.

2. The method recited in claim 1 wherein said first metal is gold.

3. The method recited in claim 2 wherein said second metal is selected from the group consisting of tungsten and titanium, 4. The method recited in claim 3 wherein said layers of said first and second metals are deposited by sputtering in a vacuum chamber.

5. The method recited in claim 3 wherein said layer of said first metal is about 100 microinches thick and wherein said layer of said second metal is about 1000 angstroms thick.

6. The method recited in claim 3 wherein said alloy is selected from the group consisting of gold-germanium and gold-silicon.

7. The method recited in claim 6 wherein said alloy is a eutectic alloy.

8. The method recited in claim 1 wherein said step of heating said preform heats said metallic surface of said device package to about 390° C.

9. The method recited in claim 1 wherein said step of heating and then cooling said preform is accomplished in an atmosphere of inert gas.

10. The method recited in claim 9 wherein said inert gas is nitrogen.

11. The method recited in claim 1 wherein said metallic surface and said layer of first metal are fused together during said heating step.

12. The method recited in claim 4 wherein said sputtering is accomplished using a planar magnetron sputtering system.

* * * * *